United States Patent
Szubbocsev

(10) Patent No.: US 11,733,873 B2
(45) Date of Patent: Aug. 22, 2023

(54) WEAR LEVELING IN SOLID STATE DRIVES

(71) Applicant: Micron Technology, Inc., Boise, ID (US)

(72) Inventor: Zoltan Szubbocsev, Haimhausen (DE)

(73) Assignee: Micron Technology, Inc., Boise, ID (US)

( * ) Notice: Subject to any disclaimer, the term of this patent is extended or adjusted under 35 U.S.C. 154(b) by 110 days.

(21) Appl. No.: 15/829,590

(22) Filed: Dec. 1, 2017

(65) Prior Publication Data

US 2019/0171372 A1   Jun. 6, 2019

(51) Int. Cl.
| | |
|---|---|
| *G06F 3/06* | (2006.01) |
| *G06F 12/10* | (2016.01) |
| *G11C 11/00* | (2006.01) |
| *G11C 16/34* | (2006.01) |
| *G11C 11/56* | (2006.01) |
| *G11C 16/16* | (2006.01) |
| *G06F 12/02* | (2006.01) |

(52) U.S. Cl.
CPC .......... *G06F 3/0616* (2013.01); *G06F 3/0649* (2013.01); *G06F 3/0688* (2013.01); *G06F 12/10* (2013.01); *G11C 11/005* (2013.01); *G11C 16/3486* (2013.01); *G11C 16/3495* (2013.01); *G06F 2212/2022* (2013.01); *G06F 2212/657* (2013.01); *G11C 11/5635* (2013.01); *G11C 16/16* (2013.01)

(58) Field of Classification Search
CPC .. G06F 3/0616; G06F 3/0649; G06F 12/0246; G06F 2212/7211

USPC .......................................................... 711/103
See application file for complete search history.

(56) References Cited

U.S. PATENT DOCUMENTS

| | | |
|---|---|---|
| 5,546,579 A | 8/1996 | Josten et al. |
| 7,383,389 B1 | 6/2008 | Bumbulis |
| 8,601,202 B1 | 12/2013 | Melcher et al. |
| 10,909,782 B1 | 2/2021 | Natanzon |
| 2002/0107619 A1 | 8/2002 | Klausner et al. |
| 2002/0154543 A1 | 10/2002 | Conley et al. |
| 2006/0261931 A1 | 11/2006 | Cheng |
| 2007/0150644 A1 | 6/2007 | Pinto et al. |
| 2007/0208904 A1 | 9/2007 | Hsieh et al. |
| 2007/0260811 A1 | 11/2007 | Merry, Jr. et al. |
| 2007/0294490 A1* | 12/2007 | Freitas ................ G06F 12/0246 711/154 |

(Continued)

OTHER PUBLICATIONS

Wikipedia, Normalization (statistics), https://en.wikipedia.org/wiki/Normalization_(statistics) (Year: 2014).*

(Continued)

*Primary Examiner* — Charles Rones
*Assistant Examiner* — Sidney Li
(74) *Attorney, Agent, or Firm* — Greenberg Traurig

(57) ABSTRACT

A computer storage device having: a host interface; a controller; non-volatile storage media having memory units of different types and having different program erase budgets; and firmware. The firmware instructs the controller to: generate an address map mapping logical addresses to physical addresses of the memory units the different types; and adjust the address map based at least in part on the program erase budgets to level wear across the memory units of the different types.

11 Claims, 2 Drawing Sheets

---

Provide a solid state drive having memory units of different types (e.g., SLC, MLC, TLC, QLC) 201

↓

Generate an address map mapping from a set of logical addresses to physical addresses of the memory units 203

↓

Adjust the address map to level wear according to program erase (P/E) budgets of the different types of memory units 205

(56) References Cited

U.S. PATENT DOCUMENTS

| | | |
|---|---|---|
| 2010/0223423 A1 | 9/2010 | Sinclair et al. |
| 2011/0131364 A1 | 6/2011 | George Gordon |
| 2011/0153913 A1 | 6/2011 | Huang et al. |
| 2012/0014013 A1 | 1/2012 | Bandic et al. |
| 2012/0072644 A1 | 3/2012 | Asano et al. |
| 2012/0198335 A1 | 8/2012 | Huang |
| 2012/0210021 A1 | 8/2012 | Flynn et al. |
| 2012/0254266 A1 | 10/2012 | Printezis et al. |
| 2012/0254267 A1 | 10/2012 | Printezis et al. |
| 2012/0284587 A1 | 11/2012 | Yu et al. |
| 2013/0036282 A1 | 2/2013 | Kawachiya et al. |
| 2013/0124787 A1* | 5/2013 | Schuette ............ G06F 12/0246 711/103 |
| 2013/0135926 A1* | 5/2013 | Roohparvar ............ G11C 16/10 365/185.03 |
| 2013/0151779 A1 | 6/2013 | Daly et al. |
| 2013/0246703 A1 | 9/2013 | Bandic et al. |
| 2014/0089264 A1 | 3/2014 | Talagala et al. |
| 2014/0136809 A1 | 5/2014 | Engle et al. |
| 2015/0347038 A1 | 12/2015 | Monteleone et al. |
| 2016/0063776 A1 | 3/2016 | Chronowski et al. |
| 2017/0031906 A1 | 2/2017 | Yang et al. |
| 2017/0237937 A1 | 8/2017 | Motohashi et al. |
| 2018/0007323 A1 | 1/2018 | Botusescu et al. |
| 2018/0162301 A1 | 6/2018 | Meng et al. |
| 2019/0171389 A1 | 6/2019 | Muthiah et al. |
| 2020/0174677 A1 | 6/2020 | Golov |

OTHER PUBLICATIONS

Kevin L. Priddy, Artificial Neural Networks an Introduction, Spie press, p. 16 (Year: 2005).*
"Everything You Need to Know About SLC, MLC, and TLC NAND Flash", MyDigitaldiscount.com, printed on Nov. 27, 2017.
"Wear Leveling", Wikipedia, printed on Nov. 27, 2017.

* cited by examiner

US 11,733,873 B2

WEAR LEVELING IN SOLID STATE DRIVES

FIELD OF THE TECHNOLOGY

At least some embodiments disclosed herein relate to computer storage devices in general and more particularly, but not limited to wear leveling in erasable computer storage media.

BACKGROUND

Some erasable computer storage media, such as Compact Disc-ReWritable, DVD recordable, DVD-RAM, electrically erasable programmable read-only memory (EEPROM), and/or flash memory, have useful service periods limited by the cycles of program and erase to store data. A program erase (P/E) budget represents a predetermined number of cycles of program and erase that can be performed reliably for recording data in an erasable medium. After the predetermined of cycles of erasure, the program erase (P/E) budget of such the erasable medium is used up; and as a result, the medium may become unreliable in a statistical sense and thus is considered at the end of its useful service life.

A solid state drive typically has many blocks of memory units. Each of the memory blocks can be programmed and erased separately. The degree of wear of each memory block is proportional to the number of erasure operations performed on the memory block.

Wear leveling can be performed in a solid state drive such that the operations of erasure are distributed across the memory blocks in the solid state drive.

For example, an address map can be used in a solid state drive to map, from a logical address used to identify a virtual storage location of a data item, to a physical address for addressing a memory unit in which the data item is actually stored. When a data write operation requires the erasure of a memory block, the address map can be updated to map the logical address to a different physical address to cause erasure operations to be distributed across the memory blocks.

For example, U.S. Pat. No. 6,850,443 discloses some wear leveling techniques in a mass storage system, the entire disclosure of which is hereby incorporated herein by reference.

Different types of NAND flash memories have been developed. For example, a single level cell (SLC) flash memory has a cell structure that stores a single bit in a reprogrammable cell; a multi level cell (MLC) flash memory has a cell structure that stores multiple bits of data (e.g., two bits) in a reprogrammable cell; a triple level cell (TLC) flash memory has a cell structure that stores three bits of data in a programmable cell; and a quad level cell (QLC) flash memory has a cell structure that stores four bits of data in a programmable cell.

Different types of flash memories have different characteristics in performance, production cost, reliability, and durability. For example, an SLC flash memory has a P/E budget between 90,000 and 100,000 cycles; an MLC flash memory has a P/E budget ranging from 10,000 to 30,000 cycles; and a TLC flash memory has a P/E budget between 3,000 to 5,000 cycles.

BRIEF DESCRIPTION OF THE DRAWINGS

The embodiments are illustrated by way of example and not limitation in the figures of the accompanying drawings in which like references indicate similar elements.

DETAILED DESCRIPTION

At least some embodiments disclosed herein provides a solid state drive that uses memory units of different types (e.g., SLC, MLC, TLC, and/or QLC) in a single pool for a set of logical addresses and performs wear leveling across the memory units of different types for the logical addresses. The erasure operations are distributed, according to program erase (P/E) budgets, across the memory units of different types in a non-uniform way, such that the memory units of different types approach their end of service lives at approximately the same time.

In general, flash memories of different types, such as SLC, MLC, TLC, and/or QLC flash memories, have different cost and benefit trade-offs. Using homogeneous memory units in a solid state drive provides the trade-offs at the drive level.

A hybrid solid state drive may include two or more types of memories. In some instances, different types of the flash memories in the hybrid solid state drive are partitioned into different areas for different purposes. The trade-offs offered by the different partitions using different types of flash memories can be exploited using special purpose programs.

In at least some embodiments disclosed herein, a pool of memory units of different types (e.g., SLC, MLC, TLC, and/or QLC) is provided as a whole in a solid state drive in a way for uniform access via a set of logical addresses. The types of the memory units used to service the logical addresses are shielded from the users of the logical addresses. Data accesses are randomly distributed within the pool of memory units of different types. Thus, the mixture of the memory units of different types provides, at a statistical sense, a new and/or custom level of trade-offs in cost, reliability, and/or durability. The pool of memory units may be a partition formed on a set of memory units allocated from the solid state drive (e.g., allocated according to a custom radio of memory units of different types), or the entire set of memory units of different types in the solid state drive, Preferably, wear leveling is performed for the pool of memory units according to the P/E budgets of the respective types of memory units to level wear across the memory units of different types within the pool.

Figure 1:
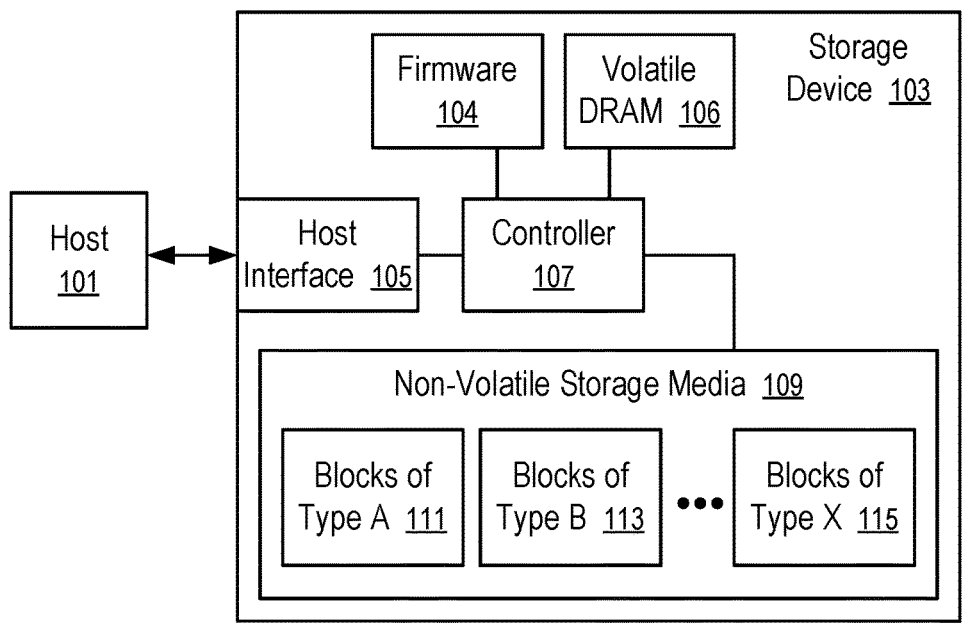
FIG. 1 shows a computer system having a hybrid storage device of one embodiment.

FIG. 1 shows a computer system having a hybrid storage device of one embodiment.

The storage device (103) in FIG. 1 includes non-volatile storage media (109) having memory blocks (111, 113, . . . , 115) of different types.

For example, the memory blocks (111, 113, . . . , 115) can be implemented using flash memories of two or more types, such as SLC, MLC, TLC, and/or QLC flash memories. SLC flash memory is reliable with a large P/E budget, but is expensive (e.g., on a per-bit basis when manufactured on an integrated circuit die of a given size); MLC flash memory has a medium P/E budget and is less expensive (e.g., on a per-bit basis when manufactured on an integrated circuit die of a given size); TLC and QLC flash memories are cheap (e.g., on a per-bit basis when manufactured on an integrated circuit die of a given size) to manufacture but have smaller P/E budgets. Using a custom ratio of memory blocks (111, 113, . . . , 115) of different types in the storage device (103) offers customized trade-offs between costs and benefits in a statistical sense, when usages of the memory units are distributed across the memory blocks (111, 113, . . . , 115) of different types.

The distribution of memory usages across the memory blocks (111, 113, . . . , 115) can be implemented via randomly map a set of logical addresses used for specifying the destinations of data storage into the memory blocks (111, 113, . . . , 115) of different types.

The distribution of memory usages across the memory blocks (111, 113, . . . , 115) can be implemented based at least in part of wear leveling operations that level the wear, caused by erasure operations, not only among the memory blocks of a same type, but also among across the memory blocks (111, 113, . . . , 115) of different types. Since different types of memory blocks have different P/E budgets, it is preferred that wear leveling operations are performed based on a normalized degree of wear relative to the P/E budgets of the memory units.

For example, a normalized degree of wear of a memory unit can be measured as being proportional to a count of the used P/E cycles of the memory unit normalized by its P/E budget such that the normalized degree of wear represents a normalized portion of the used life of the memory unit. Thus, the percentages of used erasure life of the memory blocks (111, 113, . . . , 115) are leveled across the memory blocks (111, 113, . . . , 115) of different types such that the memory blocks (111, 113, . . . , 115) of different types approach their end of life in a substantially uniform way during the usage of the storage device (103).

In FIG. 1, a host (101) communicates with the storage device (103) via a communication channel having a predetermined protocol to specify the locations of read/write operations using logical addresses. The host (101) can be a computer having one or more Central Processing Units (CPUs) to which computer peripheral devices, such as the storage device (103), may be attached via an interconnect, such as a computer bus (e.g., Peripheral Component Interconnect (PCI), PCI eXtended (PCI-X), PCI Express (PCIe)), a communication portion, and/or a computer network.

The storage device (103) can be used to store data for the host (101) in the non-volatile storage media (109). Examples of computer storage devices in general include hard disk drives (HDDs), solid state drives (SSDs), flash memory, dynamic random-access memory, magnetic tapes, network attached storage device, etc. The storage device (103) has a host interface (105) that implements communications with the host (101) using the communication channel. For example, the communication channel between the host (101) and the storage device (103) is a Peripheral Component Interconnect Express (PCI Express or PCIe) bus in one embodiment; and the host (101) and the storage device (103) communicate with each other using NVMe protocol (Non-Volatile Memory Host Controller Interface Specification (NVMHCI), also known as NVM Express (NVMe)).

In some implementations, the communication channel between the host (101) and the storage device (103) includes a computer network, such as a local area network, a wireless local area network, a wireless personal area network, a cellular communications network, a broadband high-speed always-connected wireless communication connection (e.g., a current or future generation of mobile network link); and the host (101) and the storage device (103) can be configured to communicate with each other using data storage management and usage commands similar to those in NVMe protocol.

The storage device (103) has a controller (107) that runs firmware (104) to perform operations responsive to the communications from the host (101). Firmware in general is a type of computer program that provides control, monitoring and data manipulation of engineered computing devices. In FIG. 1, the firmware (104) controls the operations of the controller (107) in operating the storage device (103), such as the usage distribution and wear leveling operations in in the storage device (103), as further discussed below.

The storage device (103) has non-volatile storage media (109), such as magnetic material coated on rigid disks, and/or memory cells in an integrated circuit. The storage media (109) is non-volatile in that no power is required to maintain the data/information stored in the non-volatile storage media (109), which data/information can be retrieved after the non-volatile storage media (109) is powered off and then powered on again. The memory cells may be implemented using various memory/storage technologies, such as NAND gate based flash memory, phase-change memory (PCM), magnetic memory (MRAM), resistive random-access memory, and 3D XPoint, such that the storage media (109) is non-volatile and can retain data stored therein without power for days, months, and/or years.

The storage device (103) includes volatile Dynamic Random-Access Memory (DRAM) (106) for the storage of run-time data and instructions used by the controller (107) to improve the computation performance of the controller (107) and/or provide buffers for data transferred between the host (101) and the non-volatile storage media (109). DRAM (106) is volatile in that it requires power to maintain the data/information stored therein, which data/information is lost immediately or rapidly when the power is interrupted.

Volatile DRAM (106) typically has less latency than non-volatile storage media (109), but loses its data quickly when power is removed. Thus, it is advantageous to use the volatile DRAM (106) to temporarily store instructions and data used for the controller (107) in its current computing task to improve performance. In some instances, the volatile DRAM (106) is replaced with volatile Static Random-Access Memory (SRAM) that uses less power than DRAM in some applications. When the non-volatile storage media (109) has data access performance (e.g., in latency, read/write speed) comparable to volatile DRAM (106), the volatile DRAM (106) can be eliminated; and the controller (107) can perform computing by operating on the non-volatile storage media (109) for instructions and data instead of operating on the volatile DRAM (106).

For example, cross point storage and memory devices (e.g., 3D XPoint memory) have data access performance comparable to volatile DRAM (106). A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

In some instances, the controller (107) has in-processor cache memory with data access performance that is better than the volatile DRAM (106) and/or the non-volatile storage media (109). Thus, it is preferred to cache parts of instructions and data used in the current computing task in the in-processor cache memory of the controller (107) during the computing operations of the controller (107). In some instances, the controller (107) has multiple processors, each having its own in-processor cache memory.

Optionally, the controller (107) performs data intensive, in-memory processing using data and/or instructions organized in the storage device (103). For example, in response to a request from the host (101), the controller (107) performs a real time analysis of a set of data stored in the storage device (103) and communicates a reduced data set to the host (101) as a response. For example, in some applications, the storage device (103) is connected to real time sensors to store sensor inputs; and the processors of the controller (107) are configured to perform machine learning and/or pattern recognition based on the sensor inputs to support an artificial intelligence (AI) system that is implemented at least in part via the storage device (103) and/or the host (101).

In some implementations, the processors of the controller (107) are integrated with memory (e.g., 106 or 109) in computer chip fabrication to enable processing in memory and thus overcome the von Neumann bottleneck that limits computing performance as a result of a limit in throughput caused by latency in data moves between a processor and memory configured separately according to the von Neumann architecture. The integration of processing and memory increases processing speed and memory transfer rate, and decreases latency and power usage.

The storage device (103) can be used in various computing systems, such as a cloud computing system, an edge computing system, a fog computing system, and/or a stand-alone computer. In a cloud computing system, remote computer servers are connected in a network to store, manage, and process data. An edge computing system optimizes cloud computing by performing data processing at the edge of the computer network that is close to the data source and thus reduces data communications with a centralize server and/or data storage. A fog computing system uses one or more end-user devices or near-user edge devices to store data and thus reduces or eliminates the need to store the data in a centralized data warehouse.

At least some embodiments of the inventions disclosed herein can be implemented using computer instructions executed by the controller (107), such as the firmware (104). In some instances, hardware circuits can be used to implement at least some of the functions of the firmware (104). The firmware (104) can be initially stored in the non-volatile storage media (109), or another non-volatile device, and loaded into the volatile DRAM (106) and/or the in-processor cache memory for execution by the controller (107).

For example, the firmware (104) can be configured to use the techniques discussed below in managing wear leveling. However, the techniques discussed below are not limited to being used in the computer system of FIG. 1 and/or the examples discussed above.

Figure 2:
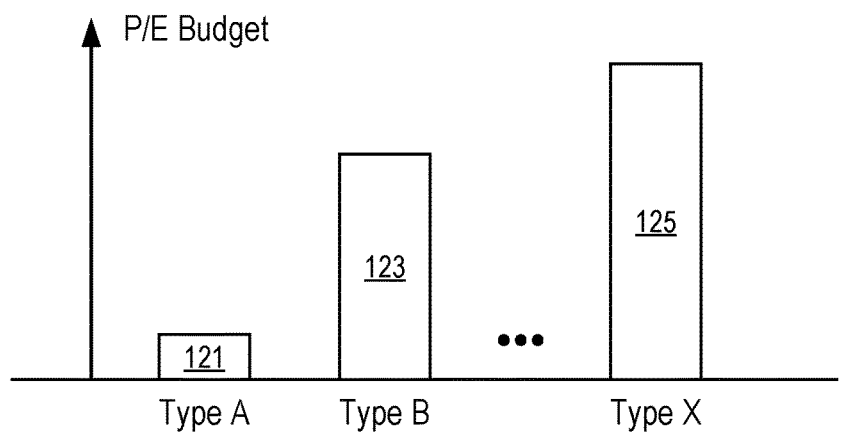
FIG. 2 illustrates different program erase budgets of different types of memory blocks for normalization of wear indications.

In FIG. 1, different memory blocks (111, 113, . . . , 115) of non-volatile storage media (109) have different P/E budgets, as illustrated in FIG. 2.

FIG. 2 illustrates different program erase (P/E) budgets (121, 123, . . . , 125) of different types of memory blocks (111, 113, . . . , 115) of FIG. 1 for normalization of wear indications.

Since different types of memory blocks (111, 113, . . . , 115) have different (P/E) budgets (121, 123, . . . , 125), one P/E cycle in different types of memory blocks (111, 113, . . . , 115) represent different degrees of wear. To facilitate the comparison of wear across different types of memory blocks (111, 113, . . . , 115), the P/E cycle can be normalized by the respective (P/E) budget (121, 123, . . . , or 125) to obtain a count of normalized P/E cycles.

For example, consider that a memory block has a P/E budget of m cycles. To normalize the budget to M cycles, each actual P/E cycle in the memory block corresponds to n=M/m normalized cycles. To avoid floating point number operations, n may be selected as the integer that is the closest to M/m. Thus, for each P/E cycle performed in the memory block, the n normalized cycles can be added to the normalized P/E cycle count of the memory block. When P/E cycles of the different types of memory blocks (111, 113, . . . , 115) are normalized according to the same normalized budget M, the normalized P/E cycle counts of memory blocks of different types can be compared directly with each other for wear leveling.

The normalized budget M can be selected according to the maximum range of a memory unit used to track the normalized P/E cycle of the memory unit. Alternatively, the normalized budget M may be the maximum one of the P/E budgets (121, 123, . . . , 125) of the memory blocks (111, 113, . . . , 115), or a multiple of the maximum one of the P/E budgets (121, 123, . . . , 125) of the memory blocks (111, 113, . . . , 115).

When the counts of normalized P/E cycles are used to compare the degrees of wear in the memory blocks (111, 113, . . . , 115), wear leveling can be performed across the memory blocks (111, 113, . . . , 115) of different types.

Wear leveling can be performed by adjusting the mapping between logical addresses and physical addresses. For example, when an instruction to write a data item to a logical address, the mapping is used to determine a physical address of a memory unit where the data item is to be physically stored. When the operation to write the date item requires the erasure of an original memory block that contains the memory unit, the controller (107) may identify an alternative memory block that has less wear and write the data item in the alternative memory block. Thus, the current erasure operation is moved from the original memory block to the alternative memory block. If the original memory block has other valid data, the valid data can be copied from the original memory block to the alternative memory block; and the original memory block can be marked as containing only invalid data and thus can be reused or erased subsequently. In response to the use of the alternative memory block for the logical address, the mapping is changed to map the logical address to the corresponding physical address in the alternative memory block, such that in response to a request to retrieve data from the logical address, the mapping can be used to determine the corresponding physical address in the alternative memory block to retrieve the data item.

The alternative memory block may be identified from the pool of memory blocks that currently do not have valid data stored therein. Such an approach levels wear across memory blocks that have been rewritten and memory blocks that do not have valid data stored therein.

The alternative memory block may also be identified from memory blocks that currently store valid data. For example, a memory block storing a data item that has not been updated for a period of time may have very low wear in comparison with other memory blocks. Thus, the logical address of such a low wear memory block can be mapped to another memory block, such that the P/E budget of the memory block can be better utilized in wear leveling.

Figure 3:
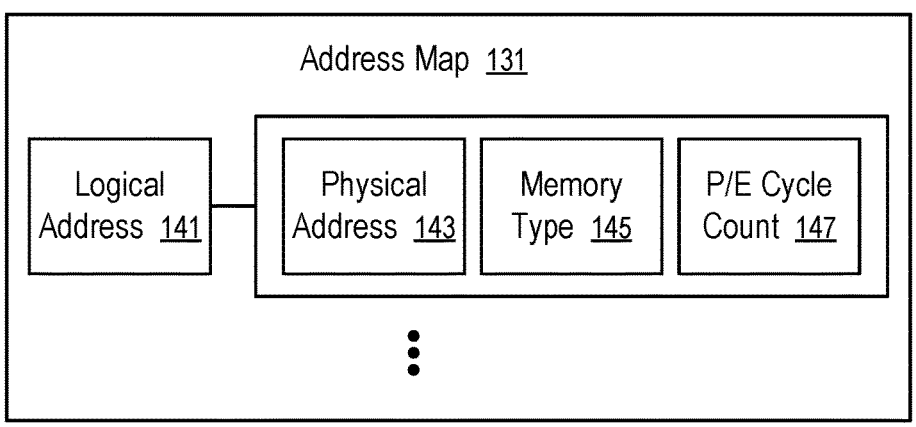
FIG. 3 illustrates an address map for wear leveling according to one embodiment.

FIG. 3 illustrates an address map for wear leveling according to one embodiment. For example, the address map can be used to identify the memory units in the storage device (103) of FIG. 1 and the degrees of wear of the memory units for wear leveling.

The address map (131) of FIG. 3 associates logical addresses (e.g., 141) with physical addresses (e.g., 143) and their wear indicators, such as memory type (145) and P/E cycle count (147).

A logical address (141) represents a unique location within a space of logical addresses for data items. Different logical addresses represent different locations. A data item stored using a logical address (141) can be retrieved using the same logical address (141). Thus, the details of the memory units, such as their types and degrees of P/E wear can be shield from the host (101) that uses logical addresses to identify memory locations.

The address map (131) associates the logical address (141) with a particular physical address (143) of a specific memory unit in the memory blocks (111, 113, . . . , 115) of the storage device.

However, the logical address (141) may not persistently identify a particular memory unit in the memory blocks (111, 113, . . . , 115) of the storage device (103) during the entire life cycle of the storage device (103).

During the life cycle of the storage device (103), the address map (131) can be updated to associate the logical address (141) with the physical address (143) of one memory unit in one time period and associate the logical address (141) with the physical address of another memory unit in another time period. The updates in the address map (131) enable the distribution of usage and erasure wear across the memory blocks (111, 113, . . . , 115).

Further, the address map (131) may associate the logical address (141) with the physical address (143) of one memory unit of a first memory type (e.g., a memory unit allocated from blocks (113) of type A) having a first P/E budget (e.g., 121) in one time period and associate the logical address (141) with the physical address of another memory unit of a second memory type (e.g., a memory unit allocated from blocks (113) of type B) having a first P/E budget (e.g., 121).

For example, a sequence of logical addresses (e.g., 141) may be initially associated by the address map (131) with physical addresses (e.g., 143) in the memory blocks (111, 113, . . . , 115) of different types (e.g., in a random or pseudorandom way). Thus, the memory usages in the storage device (103) is distributed across the memory blocks (111, 113, . . . , 115) of different types.

Since data at some of the logical addresses are updated more frequently than data at other logical addresses, some of the memory blocks (111, 113, . . . , 115) may be subjected to more P/E cycles than other memory blocks (111, 113, . . . , 115). The address map (131) can be updated to re-associate the logical addresses (e.g., 141) and the physical addresses (e.g., 143) to level wear.

The address map (131) of FIG. 3 stores the memory type (145) of the memory unit at the physical address (143) and the count (147) of P/E cycles experienced by the memory unit at the physical address (143).

In some instances, the memory type (145) is used to identify the normalized P/E increment per P/E cycle. Thus, the normalized P/E count of the memory unit at the physical address can be obtained by multiplying the P/E cycle count (147) with the normalized P/E increment per P/E cycle.

Alternatively, the P/E cycle count (147) is increased by the normalized P/E increment per P/E cycle, in response to each erasure operation performed on the memory unit at the physical address (143). Thus, the P/E cycle count (147) identifies the normalized P/E count.

In response to an instruction to write data at the logical address (141), the controller (107) determines whether the memory unit at the physical address (143) needs to be erased for programming data. In response to a determination that the memory unit needs to be erased, the controller identifies an alternative memory unit that has less wear than the memory unit at the physical address (143), changes the address map (131) such that the logical address (141) is associated with the physical address of the alternative memory unit, performs an erasure operation on the alternative memory unit to program the data into the alternative memory unit, and increments the P/E cycle count of the alternative memory unit that is now used for the logical address (141).

In one implementation, the alternative memory unit is randomly selected from a pool of candidates that have different memory types and have a normalized P/E cycle count that is a threshold value lower than the normalized P/E cycle count of the memory unit at the physical address (143).

When the alternative memory unit has stored therein valid data, the controller (107) further updates the address map (131) to relocate the data from the alternative memory unit to a further memory unit or the memory unit identified by the physical address (143) that is being replaced with the physical address of the alternative memory unit.

In some implementations, the memory type (145) is not stored when the memory type (145) can be derived efficiently from the physical address (143).

In some implementations, a memory block includes multiple memory units. The memory units in the memory block have separate physical addresses and thus separate logical addresses. However, an erasure operation is to be performed in the memory block as a whole to erase all of the memory units in the memory block. Thus, memory units in the same memory block have the same P/C cycle count (147); and the P/E cycle count (147) and/or the memory type (145) can be tracked at the memory block level, while the association between the logical addresses and the physical addresses are tracked at the memory unit level.

Figure 4:
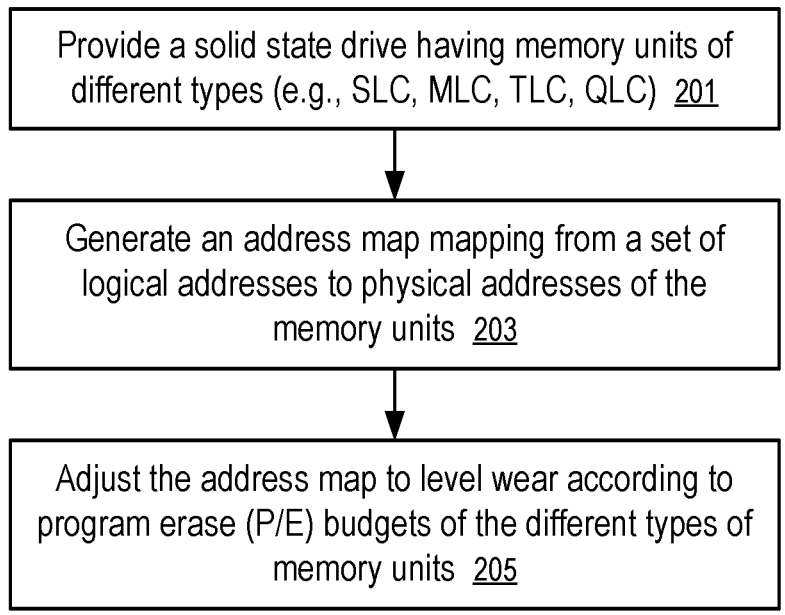
FIG. 4 shows a method to adjust an address map according to one embodiment.

FIG. 4 shows a method to adjust an address map according to one embodiment. For example, the method of FIG. 4 can be implemented in the storage device (103) of FIG. 1, using the address map (131) of FIG. 3.

The method of FIG. 4 includes: providing (201) a solid state drive (e.g., 103) having memory units of different types (e.g., SLC, MLC, TLC, QLC); generating (203) an address map (131) mapping from a set of logical addresses (e.g., 141) to physical addresses (143) of the memory units (e.g., in memory blocks (111, 113, . . . , 115); and adjusting the address map (131) to level wear according to program erase (P/E (205)) budgets (121, 123, . . . , 125) of the different types of memory units (e.g., in memory blocks (111, 113, . . . , 115).

Figure 5:
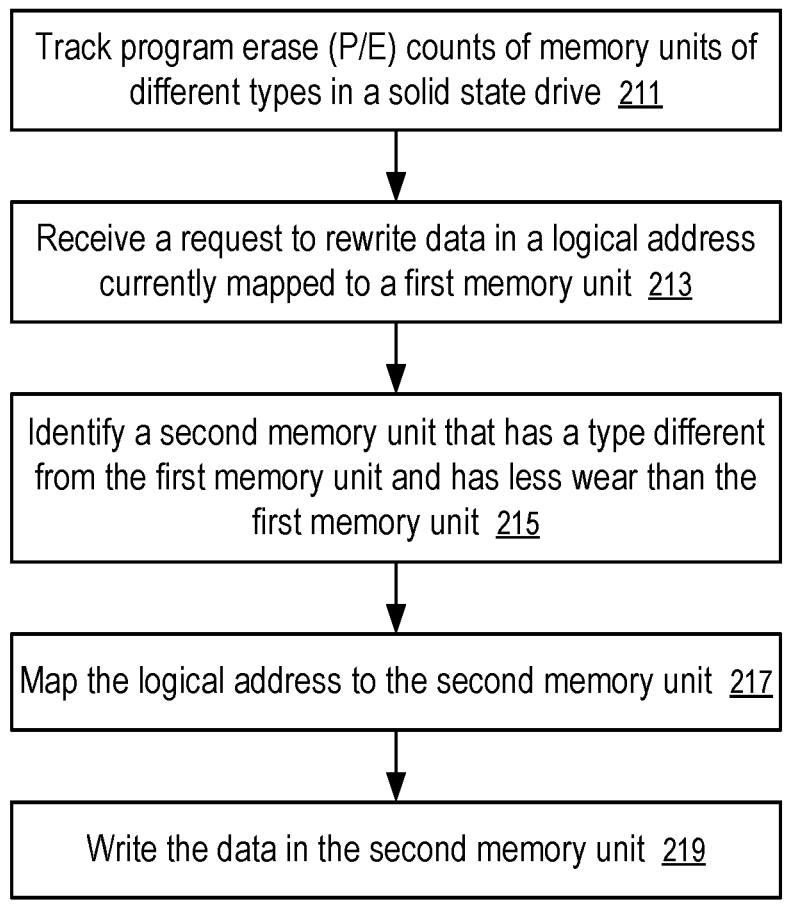
FIG. 5 shows a detailed method to adjust an address map according to one embodiment.

FIG. 5 shows a detailed method to adjust an address map according to one embodiment. For example, the method of FIG. 5 can be implemented in the storage device (103) of FIG. 1, using the address map (131) of FIG. 3.

The method of FIG. 4 includes: tracking (211) program erase (P/E) counts (147) of memory units of different types in a solid state drive (e.g., 103); receiving (213) a request to write or rewrite data in a logical address (141) currently mapped to a first memory unit (e.g., identified by the physical address (143)); identifying (215) a second memory unit that has a memory type different from the first memory unit and has less wear than the first memory unit; mapping (217) the logical address (141) to the second memory unit (e.g., identified by a corresponding physical address); and writing (219) the data in the second memory unit.

For example, the first and second memory units can be different ones of: a single level cell flash memory; a multi level cell flash memory; a triple level cell flash memory; and a quad level cell flash memory. Degrees of wear of the memory units due to erasure can be tracked and/or compared via a normalized count of P/E cycles. The normalized count is proportional to the actual P/E cycles of a memory unit and is inversely proportional to the P/E budget of the memory unit, such that the normalized counts of memory units of different types and P/E budgets (121, 123, . . . , 125) can be compared with each other. The normalized count is scaled up according to a common normalized P/E budget, which can be a multiple of the largest P/E budget of a memory block in the storage device (103), or a largest integer represented by a memory unit to store the normalized count.

A non-transitory computer storage medium can be used to store instructions of the firmware (104). When the instructions are executed by the controller (107) of the computer storage device (103), the instructions cause the controller (107) to perform any of the methods discussed above.

In this description, various functions and operations may be described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor or microcontroller, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processors in a computer, cause the computer to perform operations necessary to execute elements involving the various aspects.

A tangible, non-transitory computer storage medium can be used to store software and data which, when executed by a data processing system, causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in their entirety prior to the execution of the applications. Alternatively, portions of the data and instructions can be obtained dynamically, just in time, when needed for execution. Thus, it is not required that the data and instructions be on a machine-readable medium in their entirety at a particular instance of time.

Examples of computer-readable storage media include, but are not limited to, recordable and non-recordable type media such as volatile and non-volatile memory devices, read only memory (ROM), random access memory (RAM), flash memory devices, floppy and other removable disks, magnetic disk storage media, and optical storage media (e.g., Compact Disk Read-Only Memory (CD ROM), Digital Versatile Disks (DVDs), etc.), among others. The instructions may be embodied in a transitory medium, such as electrical, optical, acoustical or other forms of propagated signals, such as carrier waves, infrared signals, digital signals, etc. A transitory medium is typically used to transmit instructions, but not viewed as capable of storing the instructions.

In various embodiments, hardwired circuitry may be used in combination with software instructions to implement the techniques. Thus, the techniques are neither limited to any specific combination of hardware circuitry and software, nor to any particular source for the instructions executed by the data processing system.

Although some of the drawings illustrate a number of operations in a particular order, operations that are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A solid state drive, comprising:
   a host interface;
   a controller;
   a set of non-volatile memory units of different types that have different program erase budgets corresponding to the different types respectively; and
   firmware containing instructions configured to instruct the controller to:
   generate an address map mapping logical addresses to physical addresses of the memory units of the different types;

adjust the address map based at least in part on the program erase budgets to level wear across the memory units of the different types;

track degrees of wear of the memory units, wherein the degrees of wear are normalized to account for differences in the program erase budgets corresponding to the different types, wherein the degrees of wear are normalized using a largest one of the program erase budgets; and track numbers of normalized program erase cycles of the memory units, wherein the numbers of normalized program erase cycles of the memory units are proportional to number of actual program erase cycles of the memory units and inversely proportional to program erase budgets of the memory units.

2. The solid state drive of claim 1, wherein the types of the memory units include at least two of:
single level cell flash memory;
multi level cell flash memory;
triple level cell flash memory; and
quad level cell flash memory.

3. The solid state drive of claim 1, wherein the instructions are further configured to instruct the controller to:
receive a request to write data in a logical address that is currently mapped by the address map to a first memory unit;
identify a second memory unit having less wear than the first memory unit;
change the address map to map the logical address to the second memory unit; and
write the data in the second memory unit.

4. The solid state drive of claim 3, wherein the first memory unit and the second memory unit are of different types.

5. The solid state drive of claim 3, wherein the first memory unit and the second memory unit have different program erase budgets.

6. A method implemented in a solid state drive, the method comprising:
providing a set of non-volatile memory units of different types that have different program erase budgets corresponding to the different types respectively;
generating an address map mapping logical addresses to physical addresses of the memory units of the different types;
adjusting the address map based at least in part on the program erase budgets to level wear across the memory units of the different types;
tracking data indicating degrees of wear of the memory units, wherein the degrees of wear are normalized according to the program erase budgets corresponding to the different types, wherein the degrees of wear are normalized using a largest one of the program erase budgets; and tracking numbers of normalized program erase cycles of the memory units, wherein the numbers of normalized program erase cycles of the memory units are proportional to number of actual program erase cycles of the memory units and inversely proportional to program erase budgets of the memory units.

7. The method of claim 6, wherein the types of the memory units include at least two of:
single level cell flash memory;
multi level cell flash memory;
triple level cell flash memory; and
quad level cell flash memory.

8. The method of claim 6, further comprising:
receiving a request to write data in a logical address that is currently mapped by the address map to a first memory unit;
identifying a second memory unit having less wear than the first memory unit;
changing the address map to map the logical address to the second memory unit; and
writing the data in the second memory unit.

9. The method of claim 8, wherein the first memory unit and the second memory unit are of different types.

10. The method of claim 8, wherein the first memory unit and the second memory unit have different program erase budgets.

11. A non-transitory computer storage medium storing instructions which, when executed on a solid state drive, cause the solid state drive to perform a method, the method comprising:
providing data access to a set of non-volatile memory units of different types that have different program erase budgets corresponding to the different types respectively;
generating an address map mapping logical addresses to physical addresses of the memory units of the different types;
adjusting the address map based at least in part on the program erase budgets to level wear across the memory units of the different types;
tracking data indicating degrees of wear of the memory units, wherein the degrees of wear are normalized according to the program erase budgets corresponding to the different types, wherein the degrees of wear are normalized using a largest one of the program erase budgets; and
tracking numbers of normalized program erase cycles of the memory units, wherein the numbers of normalized program erase cycles of the memory units are proportional to number of actual program erase cycles of the memory units and inversely proportional to program erase budgets of the memory units.

* * * * *